(12) United States Patent
Cha et al.

(10) Patent No.: US 12,406,623 B2
(45) Date of Patent: Sep. 2, 2025

(54) DISPLAY DEVICE WITH OVERLAP LAYER

(71) Applicant: SAMSUNG DISPLAY CO., LTD., Yongin-si (KR)

(72) Inventors: Myoung Geun Cha, Seoul (KR); Sang Gun Choi, Suwon-si (KR); Ji Yeong Shin, Suwon-si (KR); Yong Su Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/424,535

(22) Filed: Jan. 26, 2024

(65) Prior Publication Data

US 2024/0172499 A1   May 23, 2024

Related U.S. Application Data

(63) Continuation of application No. 17/252,670, filed as application No. PCT/KR2018/016120 on Dec. 18, 2018, now Pat. No. 11,910,664.

(51) Int. Cl.
G09G 3/3233 (2016.01)
G09G 3/32 (2016.01)
H10K 59/123 (2023.01)
H10K 59/131 (2023.01)
H10K 77/10 (2023.01)
H10K 102/00 (2023.01)

(52) U.S. Cl.
CPC ............ *G09G 3/3233* (2013.01); *G09G 3/32* (2013.01); *H10K 59/123* (2023.02); *H10K 59/131* (2023.02); *H10K 77/111* (2023.02); *G09G 2300/0426* (2013.01); *G09G 2300/0809* (2013.01); *G09G 2320/02* (2013.01); *H10K 2102/311* (2023.02)

(58) Field of Classification Search
CPC .................................................... H10K 59/131
USPC ........................................................... 257/40
See application file for complete search history.

(56) References Cited

U.S. PATENT DOCUMENTS

| | | | |
|---|---|---|---|
| 9,276,051 | B2 | 3/2016 | Sato |
| 9,716,134 | B2 | 7/2017 | Lin et al. |
| 9,910,523 | B2 | 3/2018 | Kim et al. |

(Continued)

FOREIGN PATENT DOCUMENTS

| | | |
|---|---|---|
| JP | 2006-227586 A2 | 8/2006 |
| JP | 4942341 | 6/2012 |

(Continued)

OTHER PUBLICATIONS

Office Action dated Jul. 4, 2024 issued in the corresponding Korean Patent Application No. 10-2024-0075635.

*Primary Examiner* — Ajay Arora
(74) *Attorney, Agent, or Firm* — F. CHAU & ASSOCIATES, LLC

(57) ABSTRACT

A display device includes a substrate including a display area including a plurality of pixels, a peripheral area around the display area, and a bending area disposed in the peripheral area. A plurality of transistors is disposed in each pixel; a driving voltage line is disposed in the display area and transmits a driving voltage; a driving voltage transmission line is disposed in the peripheral area and is connected to the driving voltage line; and a conductive overlap layer overlaps at least one of the plurality of transistors.

21 Claims, 7 Drawing Sheets

(56) References Cited

U.S. PATENT DOCUMENTS

| | | |
|---|---|---|
| 9,954,043 B2 | 4/2018 | Park et al. |
| 10,025,130 B2 | 7/2018 | Kim et al. |
| 10,140,039 B1 | 11/2018 | Earuch et al. |
| 10,211,277 B2 | 2/2019 | Lee et al. |
| 10,268,296 B2 | 4/2019 | Choi et al. |
| 10,444,877 B2 | 10/2019 | Jung et al. |
| 10,475,868 B2 | 11/2019 | Park et al. |
| 10,483,098 B2 | 11/2019 | Um et al. |
| 10,483,491 B2 | 11/2019 | Choi et al. |
| 10,528,170 B2 | 1/2020 | Choi et al. |
| 10,916,616 B2 | 2/2021 | Lee et al. |
| 10,963,083 B2 | 3/2021 | Choi et al. |
| 11,036,071 B2 | 6/2021 | Um et al. |
| 11,139,454 B2 | 10/2021 | Choi et al. |
| 12,082,461 B2 * | 9/2024 | Cho .................. G09G 3/3241 |
| 2006/0250592 A1 | 11/2006 | Noguchi et al. |
| 2014/0034923 A1 | 2/2014 | Kim et al. |
| 2014/0346473 A1 | 11/2014 | Park et al. |
| 2016/0141344 A1 | 5/2016 | Sato |
| 2016/0190171 A1 | 6/2016 | Wang et al. |
| 2016/0254335 A1 | 9/2016 | Lee et al. |
| 2016/0254338 A1 | 9/2016 | Lin et al. |
| 2017/0194593 A1 | 7/2017 | Ma et al. |
| 2017/0287937 A1 * | 10/2017 | Ka .................. H10K 59/131 |
| 2022/0006054 A1 | 1/2022 | Choi et al. |
| 2022/0013617 A1 | 1/2022 | Cha et al. |
| 2023/0025912 A1 | 1/2023 | Bae et al. |

FOREIGN PATENT DOCUMENTS

| | | |
|---|---|---|
| KR | 10-2014-0018623 A | 2/2014 |
| KR | 10-2014-0039617 | 4/2014 |
| KR | 10-2014-0074037 A | 6/2014 |
| KR | 10-2014-0137950 A | 12/2014 |
| KR | 10-2015-0080257 | 7/2015 |
| KR | 10-2015-0086188 A | 7/2015 |
| KR | 10-2017-0049705 | 5/2017 |
| KR | 10-2017-0073482 A | 6/2017 |
| KR | 10-2017-0106821 | 7/2017 |
| KR | 10-2017-0080779 | 9/2017 |
| KR | 10-2017-0106591 A | 9/2017 |
| KR | 10-2017-0125161 A | 11/2017 |
| KR | 10-2018-0049325 A | 5/2018 |
| KR | 10-2018-0056497 A | 5/2018 |

* cited by examiner

DISPLAY DEVICE WITH OVERLAP LAYER

CROSS-REFERENCE TO RELATED APPLICATION

This application is a Continuation of co-pending U.S. patent application Ser. No. 17/252,670, filed on Jul. 19, 2021, which is a National Stage Entry of International Application No. PCT/KR2018/016120 filed Dec. 18, 2018, and which claims priority to Korean Patent Application Serial No. 10-2018-0069111 filed on Jun. 15, 2018, in the Korean Intellectual Property Office, the entire disclosures of each of which are incorporated herein by reference.

TECHNICAL FIELD

The present disclosure relates to a display device.

DISCUSSION OF THE RELATED ART

Display devices display images, and a light emitting diode display among them has been in the spotlight.

The light emitting diode display has a self-luminance characteristic and does not require a separate light source, unlike a liquid crystal display (LCD) device, and thus can have reduced thickness and weight. Further, the light emitting diode display represents high quality characteristics of low power consumption, high luminance, and a high reaction speed.

Generally, the light emitting diode display includes a substrate, a plurality of thin film transistors disposed on the substrate, a plurality of insulating layers disposed between wires for configuring the thin film transistors, and a light emitting element connected to the thin film transistor, and the light emitting element may be, for example, an organic light emitting element.

SUMMARY

The present invention has been made in an effort to provide a display device that may improve a degree of design freedom of a pixel in a display area while improving display characteristics.

An exemplary embodiment of the present invention provides a display device including: a substrate including a display area including a plurality of pixels, a peripheral area around the display area, and a bending area that is disposed in the peripheral area and is bent or is able to be bent; a plurality of transistors disposed in the pixel; a driving voltage line that is disposed in the display area and transmits a driving voltage; a driving voltage transmission line disposed in the peripheral area and connected to the driving voltage line; and an overlap layer that is conductive and overlaps at least one of the plurality of transistors in a plan view, wherein the overlap layer may be disposed in a layer between the substrate and the transistors, the overlap layer may include a first portion disposed in the display area and a second portion disposed in the peripheral area, the second portion may overlap the driving voltage transmission line in the plan view, the second portion may contact the driving voltage transmission line through a contact hole provided in a plurality of insulating layers disposed between the second portion and the driving voltage transmission line, and the contact hole may be disposed in the peripheral area between the display area and the bending area.

The driving voltage transmission line and the second portion may extend in a first direction, and a plurality of the contact holes may be provided along the second portion.

The plurality of insulating layers may be removed in the bending area to have a first lateral surface disposed in a vicinity of a boundary of the bending area, a first insulating layer that is disposed in the bending area and covers an upper surface of the substrate may be further included, and the first insulating layer may contact the first lateral surface.

The first lateral surface and a lateral surface of the contact hole may be stepped.

The display device may further include an active pattern disposed between the overlap layer and the driving voltage line, wherein the plurality of insulating layers may include a second insulating layer disposed between the overlap layer and the active pattern, and a third insulating layer disposed on the active pattern, the contact hole may include a first hole of the second insulating layer and a second hole of the third insulating layer, and a size of the first hole may be smaller than a size of the second hole in the plan view.

The first portion may be patterned to be a mesh type.

The display device may further include a scan line that is disposed in the display area, crosses the driving voltage line, and extends in a first direction, wherein the overlap layer may include a third portion connected to the first portion and the second portion, and the third portion may be disposed in the peripheral area and may extend in a second direction crossing the first direction.

The display device may further include a scan line that is disposed in the display area, crosses the driving voltage line, and extends in a first direction, and a pad part disposed in the peripheral area, wherein the overlap layer may include a third portion connected to the second portion, and a fourth portion spaced apart from the third portion, the third portion and the fourth portion may be spaced apart from each other with the bending area therebetween, and the fourth portion may be connected to the pad part.

The third portion and the fourth portion may extend in a second direction crossing the first direction.

Another embodiment of the present invention provides a display device including: a substrate including a display area including a plurality of pixels and a peripheral area around the display area; an overlap layer that is conductive and disposed on the substrate; a buffer layer disposed on the overlap layer; an active pattern layer disposed on the buffer layer and including a semiconductor material; a first conductive layer disposed on the active pattern layer; a first insulating layer disposed on the first conductive layer; and a second conductive layer disposed on the first insulating layer, wherein the overlap layer may include a first portion disposed in the display area, and a second portion disposed in the peripheral area, the second conductive layer may include a driving voltage line disposed in the display area and transmitting a driving voltage, and a driving voltage transmission line disposed in the peripheral area and connected to the driving voltage line, the buffer layer may have a first hole disposed on the second portion, the first insulating layer may have a second hole disposed on the second portion and overlapping the first hole, the driving voltage transmission line may contact the second portion through the first hole and the second hole in the peripheral area, and planar sizes of the first hole and the second hole may be different from each other.

The substrate may further include a bending area that is disposed in the peripheral area and is bent or is able to be bent, and a contact hole including the first hole and the second hole may be disposed in the peripheral area between the display area and the bending area.

The driving voltage transmission line and the second portion may extend in a first direction, and a plurality of the contact holes may be provided along the second portion.

The substrate may further include a bending area disposed in the peripheral area and is bent or is able to be bent, the first insulating layer may be removed in the bending area to have a first lateral surface disposed in a vicinity of a boundary of the bending area, the buffer layer may be removed in the bending area to have a second lateral surface disposed in the vicinity of the boundary of the bending area, the first lateral surface and the second lateral surface may be stepped together, and a lateral surface of the first hole and a lateral surface of the second hole may be stepped together.

The display device may further include a second insulating layer that is disposed in the bending area and covers an upper surface of the substrate, and the second insulating layer may contact the first lateral surface and the second lateral surface.

The first portion may be patterned to be a mesh type.

The display device may further include a scan line that is disposed in the display area, crosses the driving voltage line, and extends in a first direction, wherein the overlap layer may include a third portion connected to the first portion and the second portion, and the third portion may be disposed in the peripheral area and extends in a second direction crossing the first direction.

Yet another embodiment of the present invention provides a display device including: a substrate including a display area including a plurality of pixels, a peripheral area around the display area, and a bending area that is disposed in the peripheral area and is bent or is able to be bent; an overlap layer that is conductive and disposed on the substrate; a buffer layer disposed on the overlap layer; an active pattern layer disposed on the buffer layer and including a semiconductor material; a first conductive layer disposed on the active pattern layer; a first insulating layer disposed on the first conductive layer; and a second conductive layer disposed on the first insulating layer, wherein the overlap layer may include a first portion disposed in the display area, and a second portion disposed in the peripheral area, the second conductive layer may include a driving voltage line disposed in the display area and transmitting a driving voltage, and a driving voltage transmission line disposed in the peripheral area and connected to the driving voltage line, the buffer layer may have a first hole disposed on the second portion, the first insulating layer may have a second hole disposed on the second portion and overlapping the first hole, the driving voltage transmission line may contact the second portion through the first hole and the second hole in the peripheral area, and a contact hole including the first hole and the second hole may be disposed in the peripheral area between the display area and the bending area.

The driving voltage transmission line and the second portion may extend in a first direction, and a plurality of the contact holes may be provided along the second portion.

The first insulating layer may be removed in the bending area to have a first lateral surface disposed in a vicinity of a boundary of the bending area, the buffer layer may be removed in the bending area to have a second lateral surface disposed in the vicinity of the boundary of the bending area, the first lateral surface and the second lateral surface may be stepped together, and a lateral surface of the first hole and a lateral surface of the second hole may be stepped together.

The display device may further include a second insulating layer that is disposed in the bending area and covers an upper surface of the substrate, wherein the second insulating layer may contact the first lateral surface and the second lateral surface.

DETAILED DESCRIPTION OF THE DRAWINGS

Figure 1:
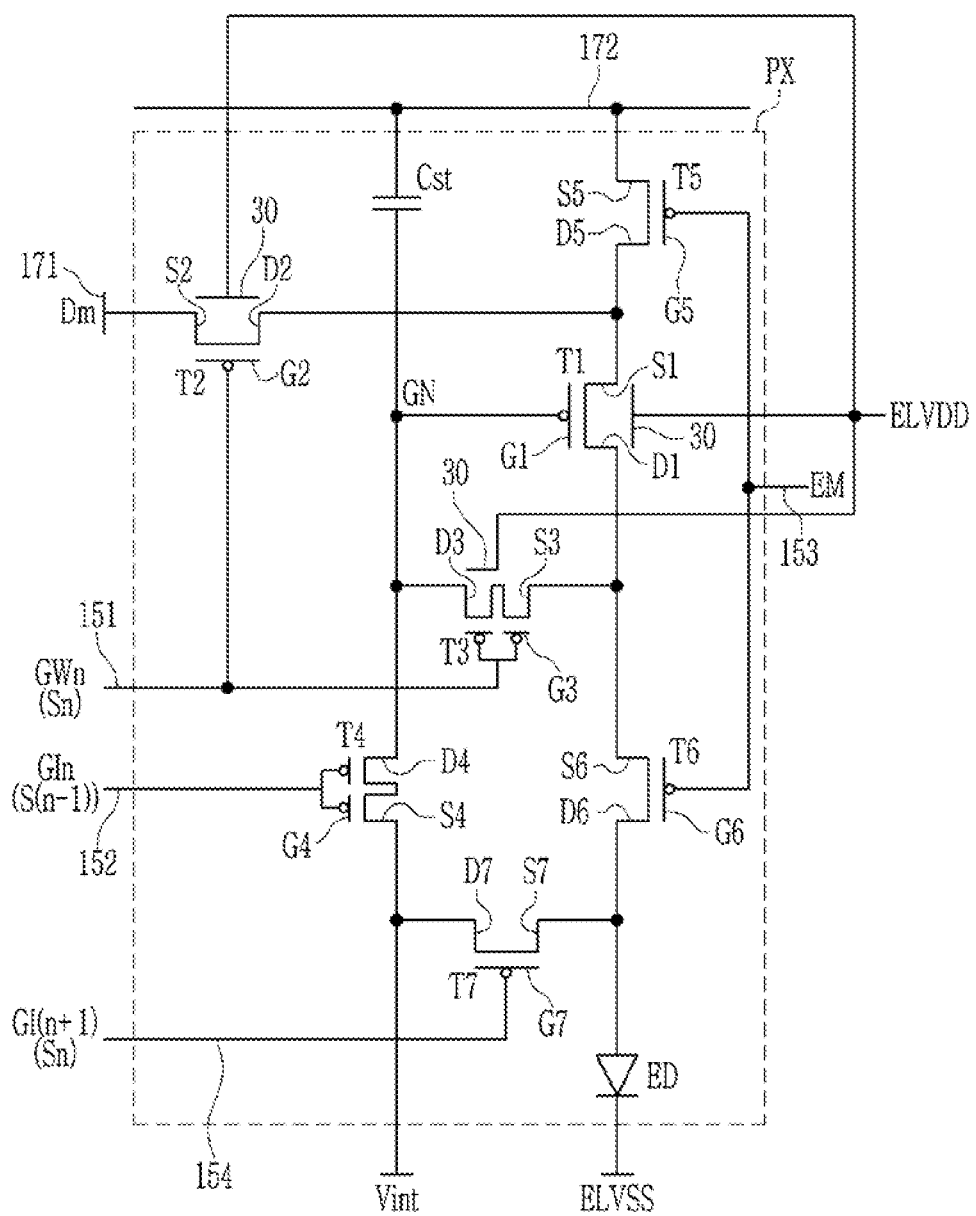
FIG. 1 is a circuit diagram of one pixel of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc. are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout this specification, a plan view means a view when observing a surface parallel to two directions (e.g., a first direction DR1 and a second direction DR2) crossing each other, and a cross-sectional view means a view when observing a surface cut in a direction (e.g., a third direction) perpendicular to the surface parallel to the first direction DR1 and the second direction DR2. Also, to overlap two constituent elements means that two constituent elements are overlapped in the third direction (e.g., a direction perpendicular to an upper surface of the substrate) unless stated otherwise.

A display device according to an exemplary embodiment will be described with reference to FIG. 1.

FIG. 1 illustrates a circuit diagram of one pixel of a display device according to an exemplary embodiment.

Referring to FIG. 1, a pixel PX of a display device according to an exemplary embodiment may include a plurality of signal lines 151, 152, 153, 154, 171, and 172, a plurality of transistors T1, T2, T3, T4, T5, T6, and T7 connected to the plurality of signal lines, a capacitor Cst, and at least one light emitting diode ED. In the present exemplary embodiment, an example in which one pixel PX includes one light emitting diode ED will be mainly described.

The signal lines 151, 152, 153, 154, 171, and 172 may include a plurality of scan lines 151, 152, and 154, a control line 153, a data line 171, and a driving voltage line 172.

The scan lines 151, 152, and 154 may respectively transmit scan signals GWn, GIn, and GI(n+1). The scan signals GWn, GIn, and GI(n+1) may transmit a gate-on voltage and a gate-off voltage capable of turning on or turning off the transistors T2, T3, T4, and T7 included in the pixel PX.

The scan lines 151, 152, and 154 connected to one pixel PX may include a first scan line 151 capable of transmitting the scan signal GWn, a second scan line 152 capable of transmitting the scan signal GIn having a gate-on voltage at a timing different from that of the first scan line 151, and a third scan line 154 capable of transmitting the scan signal GI(n+1). The second scan line 152 may transmit the gate-on voltage at a timing earlier than the first scan line 151. For example, when the scan signal GWn is an n-th scan signal Sn (here n is a positive integer) among the scan signals applied during one frame, the scan signal Gin may be a front scan signal such as an (n−1)-th scan signal S(n−1) and the like, and the scan signal GI(n+1) may be the n-th scan signal Sn. However, the present exemplary embodiment is not limited thereto, and the scan signal GI(n+1) may be a different scan signal from the n-th scan signal Sn.

The control line 153 may transmit a control signal, and particularly, may transmit a light emission control signal capable of controlling the light emission of the light emitting diode ED included in the pixel PX.

The data line 171 may transmit a data signal Dm, and the driving voltage line 172 may transmit a driving voltage ELVDD. The data signal Dm may have a different voltage level depending on an image signal inputted to the display device, and the driving voltage ELVDD may have a substantially constant level.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal Gin to the fourth transistor T4, the third scan line 154 may transmit the scan signal GI(n+1) to the seventh transistor T7, and the control line 153 may transmit the light emission control signal EM to the fifth transistor T5 and the sixth transistor T6.

A gate electrode G1 of the first transistor T1 is connected to one end of the capacitor Cst through a driving gate node GN, a source electrode S1 of the first transistor T1 is connected to the driving voltage line 172 via the fifth transistor T5, and a drain electrode D1 of the first transistor T1 is connected to an anode of the light emitting diode ED via the sixth transistor T6. The first transistor T1 may receive the data signal Dm transmitted by the data line 171 depending on a switching operation of the second transistor T2 to supply a driving current to the light emitting diode ED.

A gate electrode G2 of the second transistor T2 is connected to the first scan line 151, a source electrode S2 of the second transistor T2 is connected to the data line 171, and a drain electrode D2 of the second transistor T2 is connected to the source electrode S1 of the first transistor T1 and to the driving voltage line 172 via the fifth transistor T5. The second transistor T2 may be turned on depending on the scan signal GWn received through the first scan line 151 to transmit the data signal Dm transmitted from the data line 171 to the source electrode S1 of the first transistor T1.

A gate electrode G3 of the third transistor T3 is connected to the first scan line 151, and a source electrode S3 of the third transistor T3 is connected to the anode of the light emitting diode ED via the sixth transistor T6 while being connected to the drain electrode D1 of the first transistor T1. A drain electrode D3 of the third transistor T3 is connected to a drain electrode D4 of the fourth transistor T4, one terminal Cst1 of the capacitor Cst, and the gate electrode G1 of the first transistor T1. The third transistor T3 may be turned on depending on the scan signal GWn transmitted through the first scan line 151 to diode-connect the first transistor T1 by connecting the gate electrode G1 and the drain electrode D1 of the first transistor T1 to each other.

A gate electrode G4 of the fourth transistor T4 is connected to the second scan line 152, a source electrode S4 of the fourth transistor T4 is connected to an initialization voltage Vint, and a drain electrode D4 of the fourth transistor T4 is connected to one terminal Cst1 of the capacitor Cst and the gate electrode G1 of the first transistor T1 through the drain electrode D3 of the third transistor T3. The fourth transistor T4 is turned on depending on the scan signal GIn transmitted through the second scan line 152 to transmit the initialization voltage Vint to the gate electrode G1 of the first transistor T1, thereby performing an initialization operation of initializing the voltage of the gate electrode G1 of the first transistor T1.

A gate electrode G5 of the fifth transistor T5 is connected to the control line 153, a source electrode S5 of the fifth transistor T5 is connected to the driving voltage line 172, and a drain electrode D5 of the fifth transistor T5 is connected to the source electrode S1 of the first transistor T1 and the drain electrode D2 of the second transistor T2.

A gate electrode G6 of the sixth transistor T6 is connected to the control line 153, a source electrode S6 of the sixth transistor T6 is connected to the drain electrode D1 of the first transistor T1 and the source electrode S3 of the third transistor T3, and a drain electrode D6 of the sixth transistor T6 is electrically connected to the anode of the light emitting diode ED. The fifth transistor T5 and the sixth transistor T6 are simultaneously turned on depending on the emission control signal EM transmitted through the control line 153, thereby the driving voltage ELVDD is compensated through the diode-connected first transistor T1 to be transmitted to the light emitting diode ED.

A gate electrode G7 of the seventh transistor T7 is connected to the third scan line 154, a source electrode S7 of the seventh transistor T7 is connected to the drain electrode D6 of the sixth transistor T6 and the anode of the light emitting diode ED, and a drain electrode D7 of the seventh transistor T7 is connected to the terminal of the initialization voltage Vint and the source electrode S4 of the fourth transistor T4.

The transistors T1, T2, T3, T4, T5, T6, and T7 may be P-type channel transistors such as a PMOS, however the present invention is not limited thereto, and at least one of the transistors T1, T2, T3, T4, T5, T6, and T7 may be an N-type channel transistor. The source and drain electrodes described above are used to distinguish two electrodes positioned at opposite sides of a channel, and the terms may be interchanged.

One terminal Cst1 of the capacitor Cst is connected to the gate electrode G1 of the first transistor T1 as described above, and the other terminal Cst2 thereof is connected to the driving voltage line 172. A cathode of the light emitting diode ED may be connected to the terminal of the common voltage ELVSS transmitting the common voltage ELVSS.

The structure of the pixel PX according to an exemplary embodiment is not limited to the structure shown in FIG. 1, and a number of transistors and a number of capacitors that are included in one pixel PX and a connection relationship thereof may be variously modified.

The pixel PX of the display device according to the exemplary embodiment may further include an overlap layer 30 overlapping at least one of the transistors T1, T2, T3, T4, T5, T6, and T7 in a plan view. The overlap layer 30 may include a portion overlapping, for example, the first transistor T1, the second transistor T2, and the third transistor T3 in a plan view. Particularly, the overlap layer 30 may overlap a channel of at least one of the transistors T1, T2, T3, T4, T5, T6, and T7.

The overlap layer 30 may be formed of various conductive metals having conductivity, or a semiconductor material having conductive properties corresponding to the conductive metals.

The overlap layer 30 may receive the driving voltage ELVDD. As will be described later, a contact portion of the overlap layer 30 that is in contact with a wire or conductor transmitting the driving voltage ELVDD is not disposed in the pixel PX.

Since the overlap layer 30 may have a light blocking function for a channel of at least one of transistors T1, T2, T3, T4, T5, T6, and T7 overlapping it, it is possible to prevent a leakage current and characteristic degradation of the transistors T1, T2, T3, T4, T5, T6, and T7. When the driving voltage ELVDD is constantly applied to the overlap layer 30, a potential of the overlap layer 30 is constantly maintained, thereby preventing influence on surrounding electrodes. When the overlap layer 30 overlaps the first transistor T1, the first transistor T1 has a high data range such that a deviation of an output variation due to a variation of a voltage difference between the gate and the source and a characteristic deviation may be reduced to improve display characteristics of the display device.

Hereinafter, a specific structure of a display device according to an exemplary embodiment will be described with reference to FIG. 2 together with FIG. 1 described above.

Figure 2:
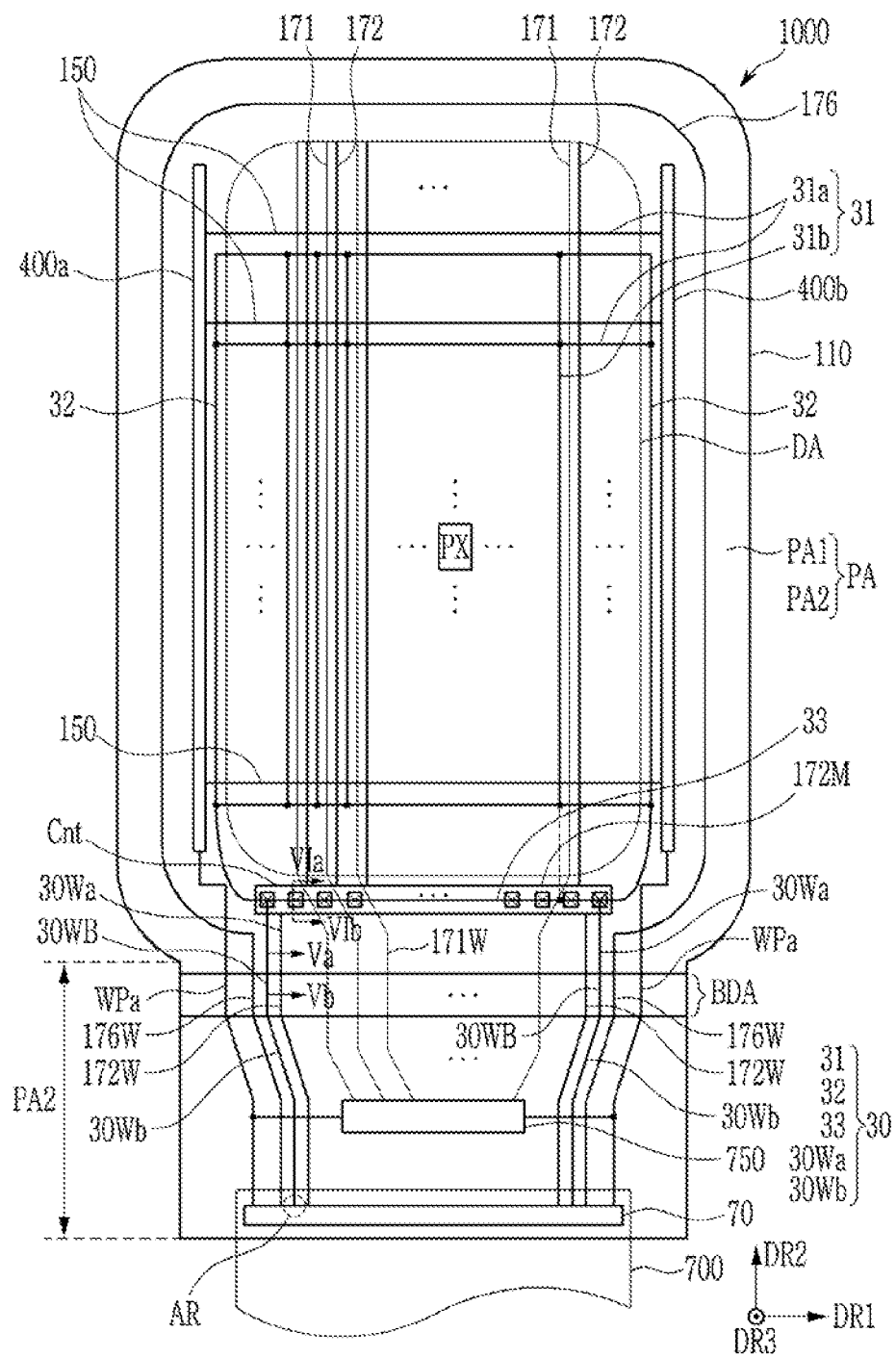
FIG. 2 is a plan view of a display device according to an exemplary embodiment.

FIG. 2 illustrates a plane layout view of a display device according to an exemplary embodiment.

The display device according to the exemplary embodiment may include a display panel 1000 including a display area DA that is an area capable of displaying an image and a peripheral area PA disposed outside or around the display area DA, and the display panel 1000 may include a substrate 110. The substrate 110 may also include the display area DA and the peripheral area PA. The peripheral area PA may include a first peripheral area PA1 disposed around the display area DA and a second peripheral area PA2 disposed outside the first peripheral area PA1.

The substrate 110 may include an insulating material such as glass, plastic, etc., and may have flexibility. For example, the substrate 110 may include various plastics such as polyethylene terephthalate (PET), polyethylene naphthalate (PEN), polycarbonate (PC), polyarylate (PAR), polyetherimide (PEI), polyethersulfone (PES), or polyimide (PI), a metal thin film, or ultra-thin glass.

An image may be displayed on a surface of the display area DA that is parallel to a first direction DR1 and a second direction DR2. The display area DA may include a plurality of pixels PX and a plurality of signal lines. The signal lines may include a plurality of gate lines 150 for transmitting a gate signal, a plurality of data lines 171 for transmitting a data signal, and a plurality of driving voltage lines 172 for transmitting the driving voltage ELVDD. The gate lines 150 include the plurality of scan lines 151, 152, and 154 as described above, and represent the scan lines 151, 152, and 154. Each gate line 150 may be substantially extend in the first direction DR1 in the display area DA, and may be connected to gate driving parts 400a and 400b disposed in the first peripheral area PA1. The data line 171 and the driving voltage line 172 cross the plurality of gate lines 150 in the display area DA and extend. The data line 171 and the driving voltage line 172 may be alternately arranged along the first direction DR1, but are not limited thereto.

The pixel PX may include at least one switching element and a pixel electrode connected thereto. The switching element may be a three-terminal element such as a transistor integrated in the display panel 1000. The switching element may be turned on or turned off depending on the gate signal transmitted by the gate line 150 to selectively transmit the data signal transmitted by the data line 171 to the pixel electrode.

The first peripheral area PA1 is adjacent to the display area DA and surrounds the periphery of the display area DA. The first peripheral area PA1 may include the gate driving parts 400a and 400b, a voltage transmission line 176, and a driving voltage transmission line 172M.

The gate driving parts 400a and 400b may be connected to the plurality of gate lines 150 to apply gate a signal scanned from top to bottom or from bottom to top to the gate lines 150. The gate driving parts 400a and 400b may be formed on the substrate 110 together with the plurality of signal lines and the switching element disposed in the display area DA. FIG. 1 shows an example in which the gate driving parts 400a and 400b are respectively disposed on the right and left sides of the display area DA, but it is not limited thereto, and one of the gate driving parts 400a and 400b may be omitted.

The voltage transmission line 176 extends along at least three sides of the left and right sides and the upper side of the display area DA, and may transmit a constant voltage such as the common voltage ELVSS. The common voltage transmitted by the voltage transmission line 176 may be, for example, −5 V, but it may be a different voltage.

The driving voltage transmission line 172M may be disposed to be adjacent to a lower side of the display area DA and substantially extends in the first direction DR1. The plurality of driving voltage lines 172 disposed in the display area DA may extend to the first peripheral area PA1, and may be connected to the driving voltage transmission line 172M to receive the driving voltage ELVDD. The driving voltage ELVDD may be a positive voltage of positive polarity, and may have a voltage level of, for example, 4 V to 6 V.

The second peripheral area PA2 is disposed below the first peripheral area PA1 at a lower side thereof, and may include a bending area BDA, a pad part 70, and a driving part 750.

The bending area BDA may extend in the first direction DR1 in the second peripheral area PA2. The display panel 1000 may be bent from the bending area BDA, and a portion of the display panel 1000 disposed outside the bending area BDA may be bent backward of the display panel 1000 to not be visible from a front surface thereof. FIG. 2 shows a state in which the display panel 1000 is unfolded without being bent in the bending area BDA. A plurality of wires may pass through the bending area BDA, and may substantially extend in the second direction DR2 in the bending area BDA.

The bending area BDA may be bendable or may be in a bent state.

The pad part 70 may be disposed near one edge of the display panel 1000 and may be disposed outside the bending area BDA. That is, the bending area BDA may be disposed between the display area DA and the pad part 70. The pad part 70 may include a plurality of pads that can be electrically connected to the driving part 750 and/or a circuit film 700 that are attached to the substrate 110. The display device according to the exemplary embodiment may further include the driving part 750 and/or the circuit film 700 that are electrically connected to the display panel 1000 through the pad part 70.

As shown in FIG. 2, the driving part 750 may be disposed on the display panel 1000 or the circuit film 700. The driving part 750 may include a driving circuit generating a driving signal for driving the display panel 1000.

The circuit film 700 may have a form of a film and may be connected to the pad part 70 of the display panel 1000. The circuit film 700 may include a driving part, a timing controller, and the like.

The voltage transmission line 176 may extend to the second peripheral area PA2 through a first voltage transmission wire 176W passing through the bending area BDA and may be connected to the pad part 70. The driving voltage transmission line 172M may extend to the second peripheral area PA2 through a second voltage transmission wire 172W passing through the bending area BDA, and may be connected to the pad part 70. The data line 171 may extend to the second peripheral area PA2 through a data wire 171W passing through the bending area BDA, and may be connected to the driving part 750.

The display panel 1000 may further include a wire part WPa connected to the gate driving parts 400a and 400b. The wire part WPa may pass through the bending area BDA to be connected to the pad part 70 and/or the driving part 750. The wire part WPa may transmit various driving signals to the gate driving parts 400a and 400b.

The overlap layer 30 described above may include a pattern part 31, a wire part 32 connected to the pattern part 31, a connection part 33 connected to the wire part 32, and extension parts 30Wa and 30Wb.

The pattern part 31 may be disposed in the display area DA in a plan view and may be patterned as a mesh type. The pattern part 31 may include a plurality of transverse extension portions 31a extending mainly in the first direction DR1, and a plurality of longitudinal extension portions 31b extending mainly in the second direction DR2. A pattern period of the pattern part 31 may be approximately one pixel PX, but is not limited thereto. That is, a distance between adjacent transverse extension portions 31a of the pattern part 31 may be substantially equal to a pitch of the second direction DR2 of the plurality of pixels PX, and a distance between the adjacent longitudinal extension portions 31b may be substantially equal to a pitch of the first direction DR1 of the plurality of pixels PX.

The wire part 32 is directly connected to the pattern portion 31 (particularly, the transverse extension portions 31a of the pattern part 31), and is disposed in the first peripheral areas PA1 of left and right sides of the display area DA. The wire part 32 may mainly extend to be parallel to the second direction DR2, and may be disposed between each of the gate driving parts 400a and 400b and the display area DA.

The connection part 33 may be connected to a pair of wire parts 32 disposed at left and right sides of the display area DA, and may be disposed in a first peripheral area PA1 disposed below the display area DA. The connection part 33 may mainly extend to be parallel to the first direction DR1. The connection part 33 may extend to be parallel to the driving voltage transmission line 172M, and in a plan view, at least some of the connection part 33 may overlap the driving voltage transmission line 172M. The connection part 33 may be electrically connected to the driving voltage transmission line 172M in the first peripheral area PA1 to receive the driving voltage ELVDD. The connection part 33 may contact the driving voltage transmission line 172M through at least one contact hole Cnt and may be electrically connected thereto. When there are a plurality of contact holes Cnt, the plurality of contact holes Cnt may form one row as shown in FIG. 2, or alternatively may be arranged in a plurality of rows. The plurality of contact holes Cnt in each row may be mainly arranged in the first direction DR1. The contact hole Cnt may be disposed between the display area DA and the bending area BDA.

The extension parts 30Wa and 30Wb may include an extension part 30Wa connected to the connection part 33 and an extension part 30Wb disposed below the bending area BDA. The extension part 30Wa may be disposed between the connection part 33 and the bending area BDA, and the two extension parts 30Wa and 30Wb may be spaced apart from each other with the bending area BDA therebetween. The extension part 30Wa may substantially extend in the second direction DR2, and the extension part 30Wb may also substantially extend in the second direction DR2 to be electrically connected to the pad part 70 in the second peripheral area PA2. The two extension parts 30Wa and 30Wb may be electrically connected to each other through a wire 30WB disposed in the bending area BDA. The wire 30WB may be disposed on a different conductive layer from the two extension parts 30Wa and 30Wb.

At least some of the extension parts 30Wa and 30Wb may be omitted.

As indicated by a dotted line below the longitudinal extension portion 31b of the pattern part 31 disposed at a right side of FIG. 2, the longitudinal extension portions 31b of the pattern part 31 may extend to the first peripheral area PA1 to be connected to the connection part 33. In FIG. 2, the dotted line is indicated only for one longitudinal extension portion 31b, but a plurality of longitudinal extension portions 31b disposed in the display area DA may be connected to the connection part 33. In this case, at least one of the wire parts 32 disposed in left and right sides of the display area DA may be omitted.

Hereinafter, a specific structure of a display device according to an exemplary embodiment will be described with reference to FIG. 3 to FIG. 6 together with FIG. 1 and FIG. 2.

Figure 3:
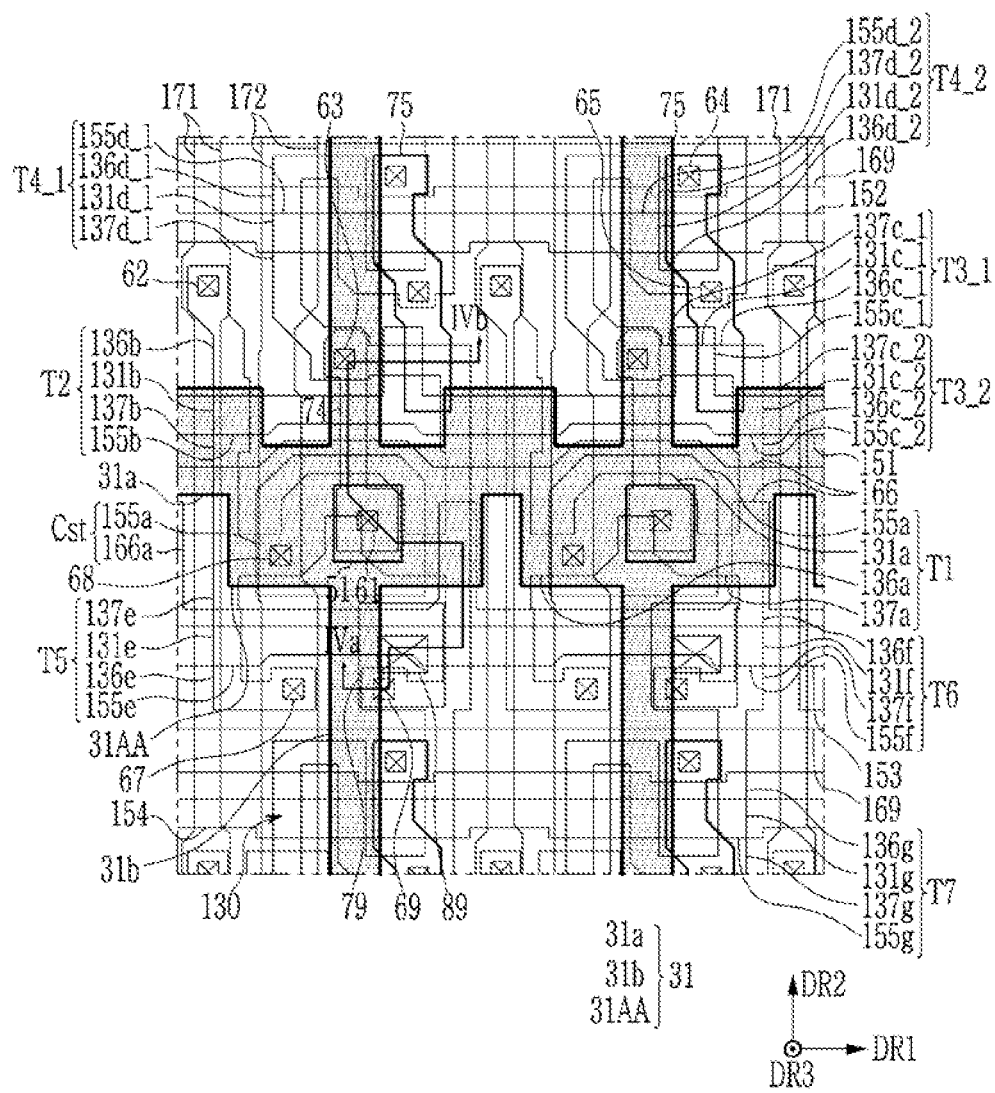
FIG. 3 is a plan view of one pixel of a display device according to an exemplary embodiment.

FIG. 3 illustrates a plan layout view of one pixel of a display device according to an exemplary embodiment, FIG.

Figure 5:
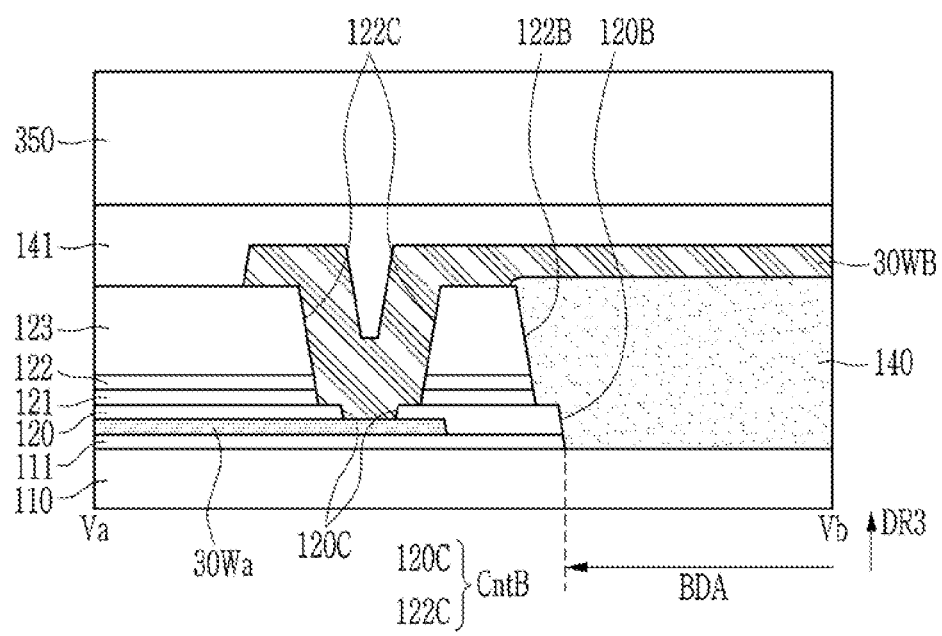
FIG. 5 is a cross-sectional view taken along line Va-Vb of FIG. 2.
Figure 6:
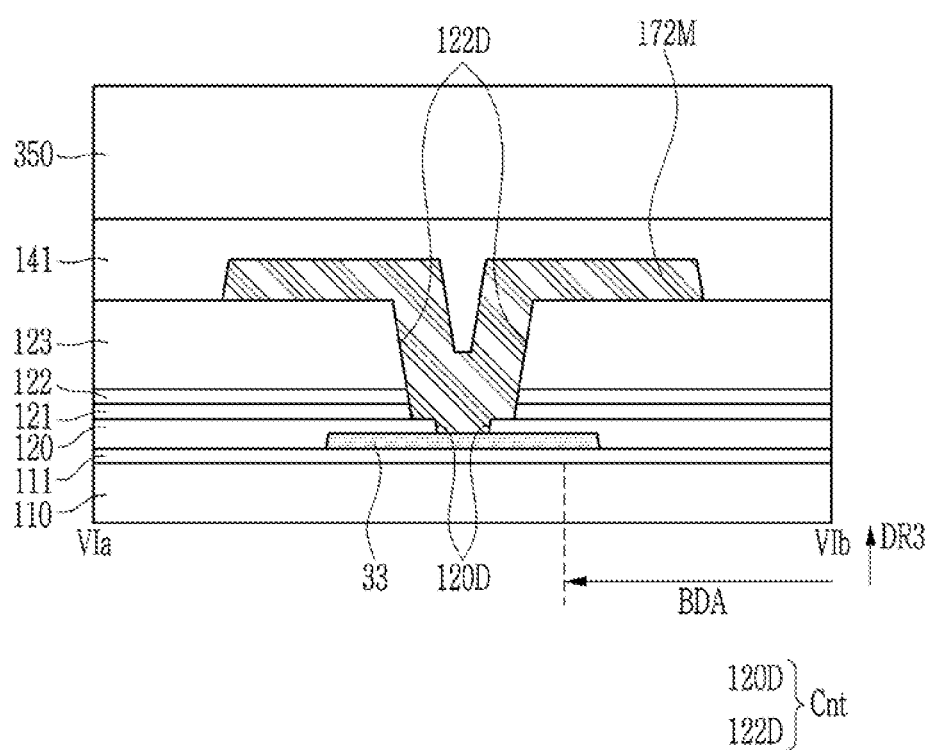
FIG. 6 is a cross-sectional view taken along line VIa-VIb of FIG. 2.

4 illustrates a cross-sectional view taken along line IVa-IVb of FIG. 3, FIG. 5 illustrates a cross-sectional view taken along line Va-Vb of FIG. 2, and FIG. 6 illustrates a cross-sectional view taken along line VIa-VIb of FIG. 2.

Figure 4:
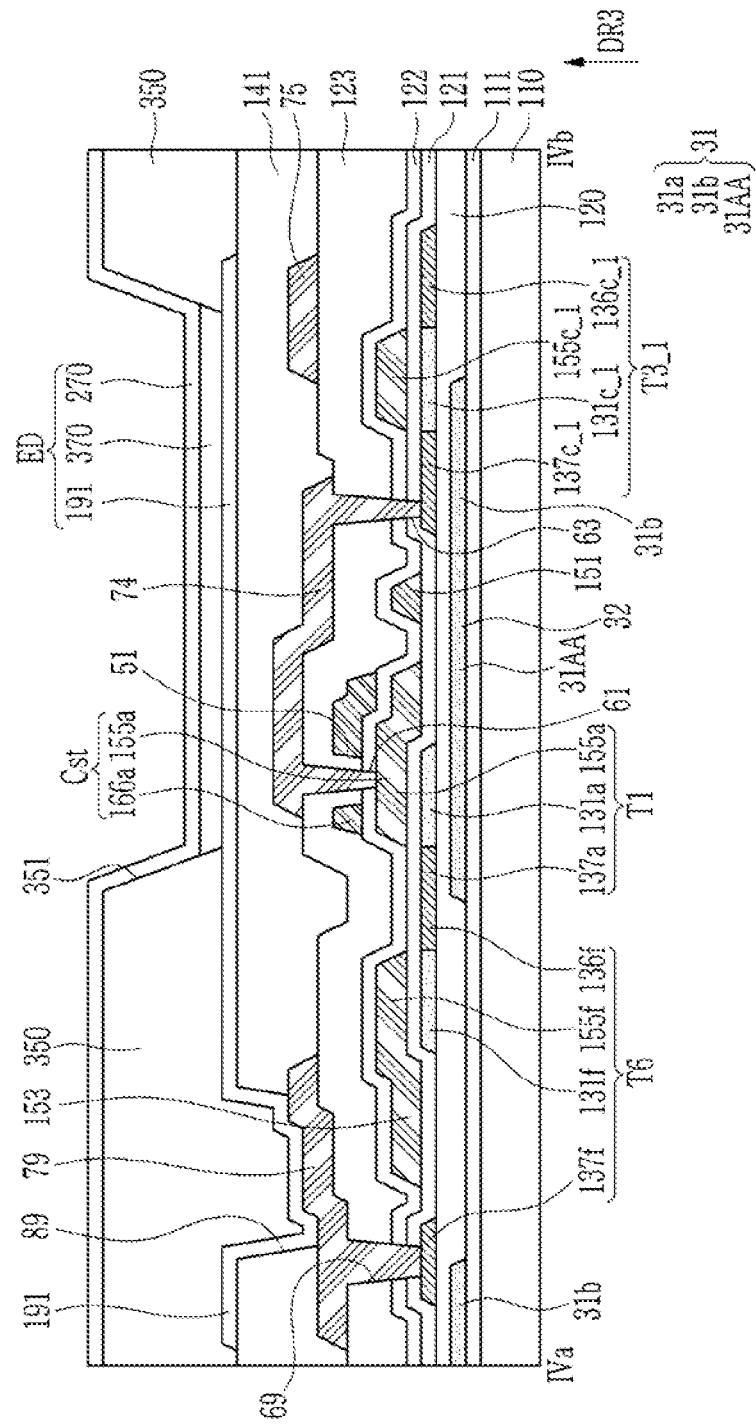
FIG. 4 is a cross-sectional view taken along line IVa-IVb of FIG. 3.

A barrier layer 111 which is an insulating layer may be disposed on the substrate 110, and the overlap layer 30 may be disposed on the barrier layer 111 as a first conductive layer. FIG. 3 and FIG. 4 illustrate the pattern part 31 included in the overlap layer 30. In a plan view, as described above, the pattern part 31 may include the transverse extension portion 31a and the longitudinal extension portion 31b connected thereto, and the transverse extension portion 31a may include an extension portion 31AA. The extension portion 31AA may be disposed at an intersection of the transverse extension portion 31a and the longitudinal extension 31b.

A buffer layer 120 which is an insulating layer is disposed on the overlap layer 30. The overlap layer 30 may be disposed between the barrier layer 111 and the buffer layer 120 in all of the display area DA and the peripheral area PA of the display panel 1000.

An active pattern 130 is disposed on the buffer layer 120. That is, the overlap layer 30 may be disposed between the substrate 110 and the active pattern 130.

The active pattern 130 may include channel areas 131a, 131b, 131c_1, 131c_2, 131d_1, 131d_2, 131e, 131f, and 131g and conductive areas for forming respective channels of the plurality of transistors T1, T2, T3_1, T3_2, T4_1, T4_2, T5, T6, and T7, described above. The conductive areas of the active pattern 130 include source areas 136a, 136b, 136c_1, 136c_2, 136d_1, 136d_2, 136e, 136f, and 136g and drain areas 137a, 137b, 137c_1, 137c_2, 137d_1, 137d_2, 137e, 137f, and 137g of respective transistors T1, T2, T3_1, T3_2, T4_1, T4_2, T5, T6, and T7. The active pattern 130 may include amorphous silicon, polysilicon, an oxide semiconductor, or the like.

A first insulating layer 121 may be disposed on the active pattern 130, and a second conductive layer may be disposed on the first insulating layer 121. The second conductive layer may include the plurality of scan lines 151, 152, and 154 and the control line 153 described above, and a driving gate electrode 155a. The plurality of scan lines 151, 152, and 154 and the control line 153 may substantially extend in the first direction DR1.

A second insulating layer 122 may be disposed on the second conductive layer and the first insulating layer 121, and a third conductive layer may be disposed on the second insulating layer 122. The third conductive layer may include a storage line 166 and an initialization voltage line 169 for transmitting an initialization voltage. The storage line 166 may include an extension portion 166a overlapping the driving gate electrode 155a.

A third insulating layer 123 may be disposed on the third conductive layer and the second insulating layer 122.

At least one of the barrier layer 111, the buffer layer 120, the first insulating layer 121, the second insulating layer 122, and the third insulating layer 123 may include an inorganic insulating material such as a silicon oxide, a silicon nitride, a silicon oxynitride, and an aluminum oxide, and/or an organic insulating material.

Some or all of the first insulating layer 121, the second insulating layer 122, and the third insulating layer 123 may include a plurality of contact holes 61, 62, 63, 64, 65, 67, 68, and 69. In some exemplary embodiments, a contact hole may not be formed in the buffer layer 120 disposed in the display area DA. That is, in the display area DA, there may be no portion where the buffer layer 120 is removed.

Referring to FIG. 5, the barrier layer 111, the buffer layer 120, the first insulating layer 121, the second insulating layer 122, and the third insulating layer 123 may be removed in the bending area BDA. The barrier layer 111, the buffer layer 120, the first insulating layer 121, the second insulating layer 122, and the third insulating layer 123 may include lateral surfaces 120B and 122B disposed near a boundary of the bending area BDA. The lateral surfaces 120B and 122B may include a lateral surface 122B of the first insulating layer 121, the second insulating layer 122, and the third insulating layer 123, and a lateral surface 120B the buffer layer 120 and the barrier layer 111. The lateral surface 122B and the lateral surface 120B are not aligned with each other, and thus may be substantially stepped. The lateral surface 120B may be closer to the bending area BDA than the lateral surface 122B.

Referring to FIG. 5, a fourth insulating layer 140 may be disposed on the substrate 110. The fourth insulating layer 140 may be mainly disposed in the bending area BDA, and may cover the substrate 110 in which the barrier layer 111, the buffer layer 120, the first insulating layer 121, the second insulating layer 122, and the third insulating layer 123 are removed to protect the bending area BDA. The fourth insulating layer 140 may contact the lateral surfaces 120B and 122B. The fourth insulating layer 140 may include a portion disposed on an upper surface of the third insulating layer 123.

Referring to FIG. 2, FIG. 5, and FIG. 6, in the peripheral area PA, portions of the buffer layer 120, the first insulating layer 121, the second insulating layer 122, and the third insulating layer 123 that are disposed on the overlap layer 30 may be removed to form contact holes Cnt and CntB. The contact hole CntB may be disposed in the vicinities of upper and lower sides of the bending area BDA in a plan view, and the contact hole Cnt may be disposed at a position overlapping the connection part 33 of the overlap layer 30.

The contact hole CntB may include a hole 120C of the buffer layer 120 and a hole 122C of the first insulating layer 121, the second insulating layer 122, and the third insulating layer 123. Although the hole 120C and the hole 122C overlap each other, a planar size of the hole 120C and a planar size of the hole 122C are different from each other, so that a lateral surface of the contact hole CntB may be substantially stepped. For example, the planar size of the hole 122C may be larger than that of the hole 120C.

Similarly, the contact hole Cnt may include a hole 120D of the buffer layer 120 and a hole 122D of the first insulating layer 121, the second insulating layer 122, and the third insulating layer 123. Although the hole 120D and the hole 122D overlap each other, a planar size of the hole 120D and a planar size of the hole 122D are different from each other, so that a lateral surface of the contact hole Cnt may be substantially stepped. For example, the planar size of the hole 122D may be larger than that of the hole 120D.

The holes 122C and 122D of the contact holes Cnt and CntB and the lateral surface 122B of the first insulating layer 121, the second insulating layer 122, and the third insulating layer 123 removed in the bending area BDA may be together formed and simultaneously in a manufacturing process step of forming the plurality of contact holes 61, 62, 63, 64, 65, 67, 68, and 69 in the display area DA. After the plurality of contact holes 61, 62, 63, 64, 65, 67, 68, and 69, the holes 122C and 122D, and the lateral surface 122B are formed, the holes 120C and 120D of the contact holes Cnt and CntB and the lateral surface 120B of the buffer layer 120 removed in the bending area BDA may be simultaneously formed. In this case, the buffer layer 120 disposed on the display area DA may have no portion to be removed.

A fourth conductive layer may be disposed on the third insulating layer 123 and the fourth insulating layer 140. The fourth conductive layer may include a plurality of connection members 74, 75, and 79, the voltage transmission line 176, the data line 171, the driving voltage line 172, and the driving voltage transmission line 172M that are connected to the source areas 136a, 136b, 136c_1, 136c_2, 136d_1, 136d_2, 136e, 136f, and 136g or drain areas 137a, 137b, 137c_1, 137c_2, 137d_1, 137d_2, 137e, 137f, and 137g of the active pattern 130.

The data line 171 and the driving voltage line 172 may substantially extend in the second direction DR2 in the display area DA to cross the plurality of scan lines 151, 152, and 154. The extension portion 166a may be connected to the driving voltage line 172 through the contact hole 68 of the storage line 166 to receive the driving voltage ELVDD.

The first transistor T1 includes the channel area 131a, the source area 136a, the drain area 137a, and the driving gate electrode 155a. The driving gate electrode 155a may be connected to the connection member 74 through the contact hole 61. The contact hole 61 may be disposed in a hole 51 included in the extension portion 166a.

The second transistor T2 includes the channel area 131b, the source area 136b, the drain area 137b, and a gate electrode 155b which is a portion of the scan line 151. The source area 136b is connected to the data line 171 through the contact hole 62, and the drain area 137b is connected to the source area 136a of the first transistor T1.

The third transistors T3_1 and T3_2 may include an upper third transistor T3_1 and a lower third transistor T3_2 connected to each other. The upper third transistor T3_1 includes the channel area 131c_1, the source area 136c_1, the drain area 137c_1, and a gate electrode 155c_1 which is a portion of the scan line 151. The drain area 137c_1 is connected to the connection member 74 through the contact hole 63. The lower third transistor T3_2 includes the channel area 131c_2, the source area 136c_2, the drain area 137c_2, and a gate electrode 155c_2 which is a portion of the scan line 151.

The fourth transistors T4_1 and T4_2 may include a left fourth transistor T4_1 and a right fourth transistor T4_2 connected to each other. The left fourth transistor T4_1 includes the channel area 131d_1, the source area 136d_1, the drain area 137d_1, and a gate electrode 155d_1 which is a portion of the scan line 152. The drain area 137d_1 may be connected to the drain area 137c_1 of the upper third transistor T3_1, and may be connected to the connection member 74 through the contact hole 63. The right fourth transistor T4_2 includes the channel area 131d_2, the source area 136d_2, the drain area 137d_2, and a gate electrode 155d_2 which is a portion of the scan line 152. The drain area 137d_2 is connected to the source area 136d_1 of the left fourth transistor T4_1, and the source area (136d_2) is connected to the connection member 75 through the contact hole 65. The connection member 75 may be electrically connected to the initialization voltage line 169 through the contact hole 64.

The fifth transistor T5 includes the channel area 131e, the source area 136e, the drain area 137e, and a gate electrode 155e which is a portion of the control line 153. The source area 136e is connected to the driving voltage line 172 through the contact hole 67, and the drain area 137e is connected to the source area 136a of the first transistor T1.

The sixth transistor T6 includes the channel area 131f, the source area 136f, the drain area 137f, and a gate electrode 155f which is a portion of the control line 153. The source area 136f is connected to the drain area 137a of the first transistor T1, and the drain area 137f is connected to the connection member 79 through the contact hole 69.

The seventh transistor T7 includes the channel area 131g, the source area 136g, the drain area 137g, and a gate electrode 155g which is a portion of the scan line 154. The source area 136g may be connected to the drain area 137f of the sixth transistor T6, and the drain area 137g may be connected to the connection member 75 through the contact hole 65 to receive the initialization voltage.

The capacitor Cst included in one pixel PX may include the extension portions 166a of the driving gate electrode 155a and the storage line 166 overlapping each other with the second insulating layer 122 therebetween, as two terminals.

Referring to FIG. 2 and FIG. 6, the driving voltage transmission line 172M connected to the driving voltage line 172 may contact the connection part 33 of the overlap layer 30 through the above-described contact hole Cnt in the first peripheral area PA1 to be electrically connected. By this structure, the overlap layer 30 may receive and transmit the driving voltage ELVDD directly from the driving voltage transmission line 172M in the peripheral area PA, not in the display area DA. Accordingly, it is not necessary for the overlap layer 30 to contact the driving voltage line 172 to receive the driving voltage ELVDD through a separate contact hole to be formed in the buffer layer 120 in a region of the pixel PX. Thus, there is no additional space loss for forming the separate contact hole in the pixel PX, so that it is possible to reduce restriction on a structural design of the pixel PX (design freedom improvement of the pixel), and no separate photomask for forming the separate contact hole is required, so that it is possible to reduce a manufacturing cost and time of the display device.

Referring to FIG. 2 and FIG. 5, the extension parts 30Wa and 30Wb of the overlap layer may be electrically connected to the wire 30WB disposed in the fourth conductive layer through the contact hole CntB disposed at the upper and lower sides of the bending area BDA in a plan view. Accordingly, as shown above, the two extension parts 30Wa and 30Wb may be electrically connected to each other through the wire 30WB disposed in the bending area BDA.

At least one of the second conductive layer, the third conductive layer, and the fourth conductive layer may include at least one of copper (Cu), aluminum (Al), magnesium (Mg), silver (Ag), gold (Au), platinum (Pt), palladium (Pd), nickel (Ni), neodymium (Nd), iridium (Jr), molybdenum (Mo), tungsten (W), titanium (Ti), chromium (Cr), tantalum (Ta), and alloys thereof. Each of the second conductive layer, the third conductive layer, and the fourth conductive layer may include a single layer or a multilayer.

The extension portion 31AA included in the pattern part 31 of the overlap layer 30 may overlap the channel area 131a of the first transistor T1 in a plan view, and the transverse extension portion 31a included in the pattern part 31 of the overlap layer 30 may overlap the channel area 131b of the second transistor T2 and the channel area 131c_2 of the lower third transistor T3_2 in a plan view. Particularly, the extension portion 31AA disposed in one pixel PX may overlap all of the channel area 131a, and the transverse extension portion 31a disposed in one pixel PX may overlap all of the channel area 131b and the channel area 131c_2. In addition, the longitudinal extension portion 31b included in the pattern part 31 of the overlap layer 30 may overlap the channel area (131d_2) of the fourth transistor T4_2 of the right side in a plan view. Particularly, the longitudinal extension portion 31b disposed in one pixel PX may overlap all of the channel area (131d_2).

The transistor overlapping the pattern part 31 of the overlap layer 30 is not limited to that shown in the drawing, and the pattern part 31 may be extended to more than that shown to overlap a channel area of a transistor other than the transistors T1, T2, T3_2, and T4_2, and the pattern part 31 may be reduced to less than that shown to overlap only a channel area of some of the transistors T1, T2, T3_2, and T4_2.

A fifth insulating layer 141 may be disposed on the fourth insulating layer 140 and the fourth conductive layer. At least one of the fourth insulating layer 140 and the fifth insulating layer 141 may include an inorganic insulating material and/or an organic insulating material such as polyimide, acrylic polymer, siloxane-based polymer, and the like.

A pixel electrode layer as the fifth conductive layer may be disposed on the fifth insulating layer 141. The pixel electrode layer may include a pixel electrode 191 and the like disposed in each pixel PX of the display area DA. The pixel electrode 191 may be connected to the connection member 79 through a contact hole 89 of the fifth insulating layer 141 to receive the data voltage.

A sixth insulating layer 350 (which may be referred to as a pixel defining layer) may be disposed on the fifth insulating layer 141. The sixth insulating layer 350 may be provided with an opening 351 formed on the pixel electrode 191. The sixth insulating layer 350 may include an organic insulating material such as a polyacrylic resin or a polyimide resin.

A light emitting layer 370 is disposed on the pixel electrode 191. The light emitting layer 370 may include a portion disposed inside the opening 351 of the sixth insulating layer 350. The light emitting layer 370 may include an organic light emitting material or an inorganic light emitting material.

A common electrode 270 is disposed on the light emitting layer 370. The common electrode 270 may be formed on the sixth insulating layer 350 to be continuously formed across the plurality of pixels PX. The common electrode 270 may be connected to the voltage transmission line 176 in the first peripheral area PA1 to receive the common voltage ELVSS. The common electrode 270 may include a conductive transparent material.

The pixel electrode 191, the light emitting layer 370, and the common electrode 270 of each pixel PX together form the light emitting diode ED, and one of the pixel electrode 191 and the common electrode 270 becomes a cathode and the other one becomes an anode.

Figure 7:
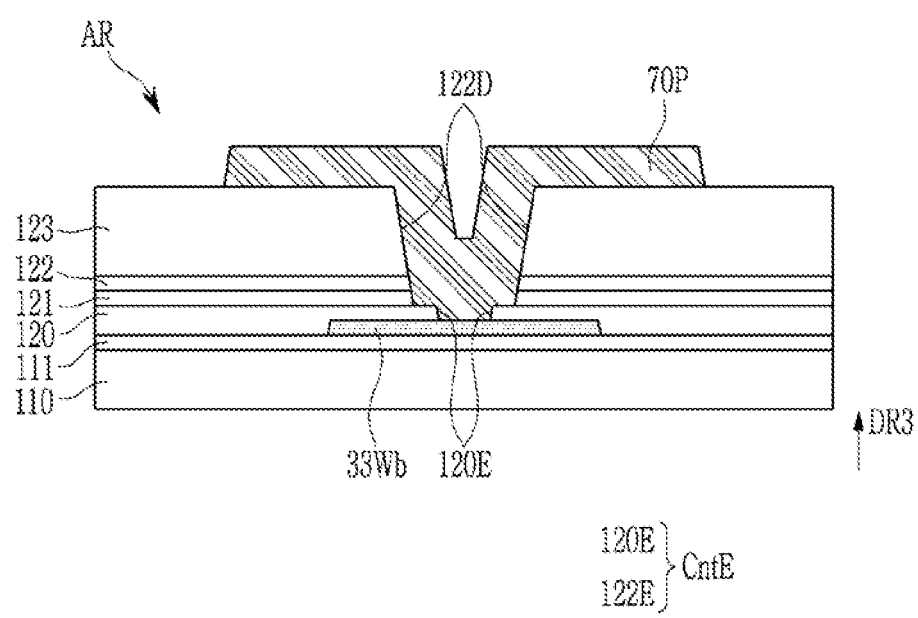
FIG. 7 is a cross-sectional view of a pad part of the display device according to the exemplary embodiment shown in FIG. 2.

FIG. 7 illustrates a cross-sectional view of a pad part of the display device according to the exemplary embodiment shown in FIG. 2.

Referring to FIG. 2 and FIG. 7, at least one pad 70P included in the pad part 70 may contact the extension part 30Wb of the overlap layer 30 to be electrically connected thereto. The pad 70P may transmit the driving voltage ELVDD transmitted from the circuit film 700.

As shown in FIG. 7, the pad 70P may be disposed on the fourth conductive layer disposed on the third insulating layer 123. In this case, the buffer layer 120, the first insulating layer 121, the second insulating layer 122, and the third insulating layer 123 disposed on the extension part 30Wb overlapping the pad 70P may be removed to form a contact hole CntE, and the pad 70P may contact the extension part 30Wb of the overlap layer 30 through the contact hole CntE to be electrically connected thereto.

Similar to the contact hole Cnt or the contact hole CntB described above, the contact hole CntE may include a hole 120E of the buffer layer 120 and a hole 122E of the first insulating layer 121, the second insulating layer 122, and the third insulating layer 123. Although the hole 120E and the hole 122E overlap each other, a planar size of the hole 120E and a planar size of the hole 122E are different from each other, so that a lateral surface of the contact hole CntE may be substantially stepped. For example, the planar size of the hole 122E may be larger than that of the hole 120E. The contact hole CntE may be simultaneously formed by the manufacturing process of the above-described contact holes Cnt and CntB.

Unlike as shown, the pad 70P may be disposed on the second conductive layer between the first insulating layer 121 and the second insulating layer 122 or on the third conductive layer between the second insulating layer 122 and the third insulating layer 123. In this case, through a contact hole (which may have a stepped form) formed in the first insulating layer 121 and the buffer layer 120 or a contact hole (which may have a stepped form) formed in the first and second insulating layers 121 and 122 and the buffer layer 120, the pad 70P and the extension part 30Wb may contact each other to be electrically connected.

According to another exemplary embodiment, when at least a portion of the extension parts 30Wa and 30Wb of the overlap layer 30 is omitted, the overlap layer 30 may not be electrically connected to the pad part 70.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the present disclosure.

What is claimed is:

1. A display device, comprising:
a substrate including a display area including a plurality of pixels, and a peripheral area at least partially surrounding the display area;
a first transistor disposed in each of the plurality of pixels, the first transistor including a semiconductor layer including a channel area;
an overlap layer disposed between the channel area of the first transistor and the substrate in a sectional view, the overlap layer overlapping the channel area of the first transistor in a plan view; and
a driving voltage line disposed over the first transistor in the sectional view and transmitting a driving voltage,
wherein the overlap layer is supplied with the driving voltage through a contact hole which is for electrical connection between the overlap layer and the driving voltage line, and
wherein the contact hole is not disposed in an area of the pixel.

2. The display device of claim 1, wherein the contact hole is disposed in the peripheral area.

3. The display device of claim 1, wherein:
the overlap layer includes first portions each overlapping the channel area of the first transistor of the plurality of pixels, and second portions connected to the first portions, and
the first portions and the second portions form a mesh type.

4. The display device of claim 1, wherein the first transistor is electrically connected to the driving voltage line.

5. The display device of claim 1, further comprising:
a driving voltage transmission line disposed in the peripheral area and connected to the driving voltage line,
wherein the overlap layer further includes a third portion disposed in the peripheral area, and
wherein the third portion contacts the driving voltage transmission line through the contact hole.

6. The display device of claim 5, further comprising:
a plurality of insulating layers disposed between the third portion and the driving voltage transmission line,
wherein the contact hole is formed in the plurality of insulating layers.

7. The display device of claim 6, wherein:
the driving voltage transmission line and the third portion extend in a first direction, and
a plurality of the contact holes are provided along the third portion.

8. The display device of claim 1, wherein:
the peripheral area includes a bending area, and
the contact hole is disposed between the display area and the bending area.

9. The display device of claim 1, further comprising:
a scan line that is disposed in the display area, crosses the driving voltage line, and extends in a first direction, and
a pad part disposed in the peripheral area,
wherein the overlap layer comprises a third portion and a fourth portion spaced apart from each other in the peripheral area,
wherein the third portion and the fourth portion are spaced apart from each other with a bending area therebetween, and
wherein the fourth portion is connected to the pad part.

10. The display device of claim 9, wherein the third portion and the fourth portion extend in a second direction crossing the first direction.

11. A display device, comprising:
a substrate including a display area including a plurality of pixels and for displaying an image, and a peripheral area at least partially surrounding the display area;
a first transistor disposed in each of the plurality of pixels, the first transistor including a semiconductor layer including a channel area;
an overlap layer disposed between the channel area of the first transistor and the substrate in a sectional view, the overlap layer overlapping the channel area of the first transistor in a plan view;
a driving voltage line disposed over the first transistor in the sectional view and transmitting a driving voltage; and
an insulating layer on the overlap layer and in contact with an upper surface of the overlap layer,
wherein the insulating layer does not have any contact hole on the overlap layer in the display area.

12. The display device of claim 11, wherein:
the overlap layer includes first portions each overlapping the channel area of the first transistor of the plurality of pixels, and second portions connected to the first portions, and
the first portions and the second portions form a mesh type.

13. The display device of claim 11, wherein the first transistor is electrically connected to the driving voltage line.

14. The display device of claim 11, wherein the insulating layer has a contact hole disposed on the overlap layer and in the peripheral area.

15. The display device of claim 14, further comprising:
a driving voltage transmission line disposed in the peripheral area and connected to the driving voltage line,
wherein the overlap layer further includes a third portion disposed in the peripheral area, and
wherein the third portion contacts the driving voltage transmission line through the contact hole.

16. The display device of claim 15, further comprising:
a plurality of insulating layers disposed between the third portion and the driving voltage transmission line,
wherein the contact hole is formed in the plurality of insulating layers.

17. The display device of claim 16, wherein:
the driving voltage transmission line and the third portion extend in a first direction, and
a plurality of the contact holes are provided along the third portion.

18. The display device of claim 14, wherein:
the peripheral area includes a bending area, and
the contact hole is disposed between the display area and the bending area.

19. The display device of claim 11, further comprising:
a scan line that is disposed in the display area, crosses the driving voltage line, and extends in a first direction, and
a pad part disposed in the peripheral area,
wherein the overlap layer comprises a third portion and a fourth portion spaced apart from each other in the peripheral area,
wherein the third portion and the fourth portion are spaced apart from each other with a bending area therebetween, and
wherein the fourth portion is connected to the pad part.

20. The display device of claim 19, wherein the third portion and the fourth portion extend in a second direction crossing the first direction.

21. An electronic device, comprising:
a substrate including a display area including a plurality of pixels, and a peripheral area at least partially surrounding the display area;
a first transistor disposed in each of the plurality of pixels, the first transistor including a semiconductor layer including a channel area;
an overlap layer disposed between the channel area of the first transistor and the substrate in a sectional view, the overlap layer overlapping the channel area of the first transistor in a plan view; and
a driving voltage line disposed over the first transistor in the sectional view and transmitting a driving voltage,
wherein the overlap layer is supplied with the driving voltage through a contact hole which is for electrical connection between the overlap layer and the driving voltage line, and
wherein the contact hole is not disposed in an area of the pixel.

* * * * *